| (12) | United States Patent | (10) Patent No.: | US 11,143,674 B2 |
|---|---|---|---|
| | Chen et al. | (45) Date of Patent: | Oct. 12, 2021 |

(54) PROBE HEAD WITH LINEAR PROBE

(71) Applicant: MPI CORPORATION, Chu-Pei (TW)

(72) Inventors: Tzu Yang Chen, Chu-Pei (TW); Chia Ju Wei, Chu-Pei (TW)

(73) Assignee: MPI CORPORATION, Chu-Pei (TW)

( * ) Notice: Subject to any disclaimer, the term of this patent is extended or adjusted under 35 U.S.C. 154(b) by 317 days.

(21) Appl. No.: 16/459,076

(22) Filed: Jul. 1, 2019

(65) Prior Publication Data

US 2020/0011898 A1 Jan. 9, 2020

(30) Foreign Application Priority Data

Jul. 4, 2018 (TW) .................................. 107123156
Apr. 29, 2019 (TW) .................................. 108114926

(51) Int. Cl.
*G01R 1/067* (2006.01)
*G01R 1/073* (2006.01)

(52) U.S. Cl.
CPC ........... *G01R 1/0675* (2013.01); *G01R 1/067* (2013.01); *G01R 1/06733* (2013.01); *G01R 1/073* (2013.01); *G01R 1/07307* (2013.01); *G01R 1/07357* (2013.01)

(58) Field of Classification Search
CPC ....... G01R 1/067; G01R 1/0675; G01R 1/073
See application file for complete search history.

(56) References Cited

U.S. PATENT DOCUMENTS 10,119,991 B2 * 11/2018 Chen .................... G01R 1/0408
2014/0352460 A1 * 12/2014 Kuo ...................... G01R 1/0675
73/866.5

FOREIGN PATENT DOCUMENTS

TW 201215895 A1 4/2012
TW 201447309 A 12/2014

* cited by examiner

*Primary Examiner* — Amy He
(74) *Attorney, Agent, or Firm* — Birch, Stewart, Kolasch & Birch, LLP

(57) ABSTRACT

A probe head includes a linear probe which is flattened at least one of tail, body and head portions thereof and thereby defined with first and second width axes, along which each of the tail, body and head portions is defined with first and second widths, and upper and lower die units having upper and lower installation holes respectively, wherein the tail and head portions are inserted respectively, which are offset from each other along the second width axis so that the body portion is curved. The first and second widths of the body portion are respectively larger and smaller than the first and second widths of at least one of the tail and head portions. As a result, the probes of the same probe head are consistent in bending direction and moving behavior and prevented from rotation, drop and escape.

20 Claims, 16 Drawing Sheets

PROBE HEAD WITH LINEAR PROBE

BACKGROUND OF THE INVENTION

1. Field of the Invention

The present invention relates generally to probe heads and probes of probe cards and more particularly, to a probe head with a linear probe.

2. Description of the Related Art

Referring to FIG. 1, a conventional probe head 10 equipped with a plurality of linear probes 16 is shown. The conventional probe head 10 primarily includes at least two upper dies 12, at least two lower dies 14 and a plurality of probes 16. For simplifying the drawing, only one probe 16 is shown in FIG. 1. The head portion 162 of each of the probes 16, i.e. linear probes, is adapted to contact a conductive contact pad of a device under test (not shown), and the head portion 162 is inserted through the lower dies 14. The tail portion 164 of each of the probes 16 is adapted to be abutted against a conductive contact pad of a circuit board or space transformer (not shown), and the tail portion 164 is inserted through the upper dies 12. During the assembly of the probe head 10, after the probes 16 are inserted through the dies 12 and 14, the upper dies 12 and the lower dies 14 are horizontally displaced from each other to make the head portion 162 and tail portion 164 of each probe 16 offset from each other and thereby not located on the same imaginary straight line, so that the body portion 166 of each probe 16 is curved. In this way, when the probe 16 contacts the conductive contact pad of the device under test, the body portion 166 of the probe 16 can provide an elastically adjusting effect to cause the head portion 162 to be in contact with and electrically connected with the conductive contact pad of the device under test positively, and a buffering effect to avoid damage or excessive wear to the conductive contact pad of the device under test or the probe due to an excessive contact force.

The conventional linear probe, also called wire needle, is formed by directly cutting a metal wire having circular cross sections into an appropriate length and thus cylinder-shaped. Therefore, during the above-described assembly of the probe head 10, the body portions 166 of the probes 16 may be inconsistent in the direction of the bending deformation due to the horizontal relative displacement of the upper and lower dies 12 and 14. Besides, when the head portions 162 of the probes 16 are abutted against the conductive contact pads of the device under test, the body portions 166 of the probes 16 may be inconsistent in the moving behavior due to the elastic deformation thereof, and the entirety of each probe 16 is also liable to rotate a little bit so that the body portions 166 of the probes 16 are more inconsistent in bending direction.

However, the linear probe is widely used in the field of fine pitch, which means the pitch of the probes 16 of the probe head 10 is usually quite small. Therefore, the above-mentioned inconsistent deformation direction, inconsistent moving behavior and self-rotation of the probes 16 are all liable to cause the body portions 166 of the adjacent probes 16 to interfere with each other. In other words, the body portions 166 of the adjacent probes 16 may collide with each other, thereby not only deteriorating the aforesaid elastically adjusting effect and buffering effect but also causing wear to the body portions 166. If the abrasion of the insulating layer on the surface of the body portions 166 causes electrical connection between the probes 16 colliding with each other, a short circuit may occur to damage the probe card or the device under test.

In addition, the conventional linear probe is liable to have the problem of probe drop, i.e. the probe 16 dropping from the downside of the lower die 14, or probe escape, i.e. the probe 16 being escaped from the upside of the upper die 12, during the assembly or maintenance of the probe card 10. The conventional method of solving the problem of probe drop or probe escape is providing a stopper to the probe at an appropriate position thereof to restrict the probe in the upper and lower dies by the stopper being abutted against the upper and lower dies. However, the stopper of the conventional probe is usually formed by adding a protruding block on the outer peripheral surface of the original probe. Such method is not suitable for the linear probe manufactured by cutting a cylindrical metal wire.

SUMMARY OF THE INVENTION

The present invention has been accomplished in view of the above-noted circumstances. It is an objective of the present invention to provide a probe head with a linear probe, which can attain at least one of the effects of consistent bending direction of the probes of the same probe head, consistent moving behavior of the probes of the same probe head, avoiding self-rotation of the probe, avoiding probe drop and avoiding probe escape.

To attain the above objective, the present invention provides a probe head which includes a linear probe, a lower die unit having a lower installation hole, and an upper die unit having an upper installation hole. The linear probe includes a tail portion, a body portion and a head portion extending along a longitudinal axis in order. At least one of the tail portion, the body portion and the head portion is flattened and thereby defined with a first width axis perpendicular to the longitudinal axis, and a second width axis perpendicular to the longitudinal axis and the first width axis. Each of the tail portion, the body portion and the head portion is defined with a first width along the first width axis and a second width along the second width axis. The first width and the second width of the body portion are respectively larger than and smaller than the first width and the second width of at least one of the tail portion and the head portion. The head portion and the tail portion of the linear probe are inserted through the lower installation hole and the upper installation hole respectively. The lower installation hole and the upper installation hole are defined with a first central axis and a second central axis respectively. The second central axis is offset from the first central axis along the second width axis and thereby the body portion of the linear probe is curved. The upper die unit includes a first upper die and a second upper die. The first and second upper dies respectively have a first through hole and a second through hole for the head portion, the body portion and the tail portion of the linear probe to be inserted therethrough. The first and second through holes are offset from each other along the first width axis to collectively form the upper installation hole.

As a result, at least one of the tail portion and the head portion is different from the body portion in area moment of inertia because of the above-described difference in the first and second widths. For example, the area moment of inertia ($I_x$) of the body portion with respect to the first width axis (X-axis) is smaller than the area moment of inertia of ($I_x$) of at least one of the tail portion and the head portion with respect to the first width axis (X-axis). Because of such difference in area moment of inertia, the body portion is liable to elastic bending deformation in a specific direction when the linear probe is applied with a force along the second width axis (Y-axis). Therefore, setting the first and second widths of the tail portion, the body portion and the head portion can control the directions of the deformation and movement of the linear probe due to the relative displacement between the upper and lower die units and the contact between the head portion and the device under test in a way that the probes of the same probe head are consistent in bending direction and moving behavior thereof and thereby prevented from interference and short circuit. In particularly, the tail portion, the body portion and the head portion may, but unlimited to, be all flattened in a way that the long sides of the cross sections of the tail and head portions are perpendicular to the long sides of the cross sections of the body portion, such that the above-mentioned effects are optimized. For example, the linear probe may be formed in a way that a cylindrical needle is at least partially flattened to become the linear probe, and the direction in which the tail portion and the head portion are flattened is perpendicular to the direction in which the body portion is flattened, so that the first and second widths of the body portion are respectively larger than and smaller than the diameter of the needle and the first and second widths of each of the tail and head portions are respectively smaller than and larger than the diameter of the needle, thereby optimizing the above-mentioned effects.

Besides, in the condition that the body portion and the tail portion have the above-described difference in the first and second widths thereof, such as the condition that the body portion and the tail portion are flattened in the directions perpendicular to each other like the above-described manner or the condition that only one of the body portion and the tail portion is flattened and the other one is maintained with cylindrical shape with first and second widths both equal to the diameter of the needle, an upper stopping portion exists at the junction of the body portion and the tail portion, which can be abutted on the bottom surface of the upper die unit as long as the width of the upper installation hole defined along the first width axis is smaller than the first width of the body portion, such that the problem of probe escape is avoided.

Likewise, in the condition that the body portion and the head portion have the above-described difference in the first and second widths thereof, such as the condition that the body portion and the head portion are flattened in the directions perpendicular to each other like the above-described manner or the condition that only one of the body portion and the head portion is flattened and the other one is maintained with cylindrical shape, a lower stopping portion exists at the junction of the body portion and the head portion, which can be abutted on the top surface of the lower die unit as long as the width of the lower installation hole defined along the first width axis is smaller than the first width of the body portion, such that the problem of probe drop is avoided.

In addition, the at least one of the tail portion, the body portion and the head portion being flattened has cross sections having an elongated shape, such as an elongated shape with two arc sides. The upper installation hole and/or the lower installation hole may be shaped according to the flattened tail portion and/or head portion to have an elongated shape such as a rectangle, such that the linear probe is prevented from self-rotation. Besides, the tail portion and/or the head portion can move smoothly in the upper installation hole and/or the lower installation hole and release stress because of having the arc-shaped parts.

The above-mentioned upper installation hole with the elongated shape is formed by the first and second through holes having relatively larger areas, wherein the area of the first through hole and the area of the second through hole may be larger than the area of the lower installation hole, and the shape of each of the first and second through holes may be a circle or a square. Such upper installation hole is not only effective in preventing the probe from self-rotation and avoiding probe escape as mentioned above, but also convenient for the installation of the probe.

The above-mentioned lower installation hole may include a lower part and an upper part, and only the lower part is an elongated-shaped hole corresponding to the flattened head portion for preventing the probe from self-rotation. The upper part may be a circular hole with the diameter larger than or equal to the length of the elongated-shaped hole and larger than the width of the elongated-shaped hole and the first and second widths of the body portion. In this way, the circular upper part can reduce the wear of the head portion and the lower die unit, and the lower part is still effective in stopping the body portion to avoid the problem of probe drop.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DETAILED DESCRIPTION OF THE INVENTION

Figure 1:
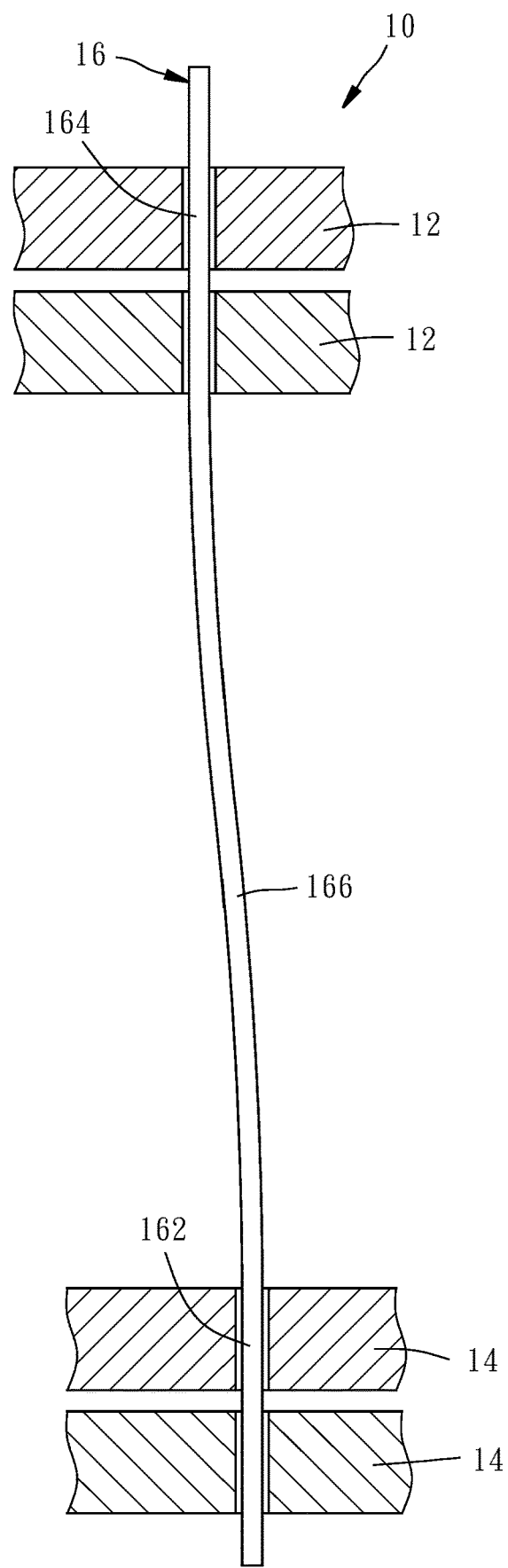
FIG. 1 is a sectional view of a conventional probe head.

First of all, it is to be mentioned that same reference numerals used in the following preferred embodiments and the appendix drawings designate same or similar elements throughout the specification for the purpose of concise illustration of the present invention.

Figure 2:
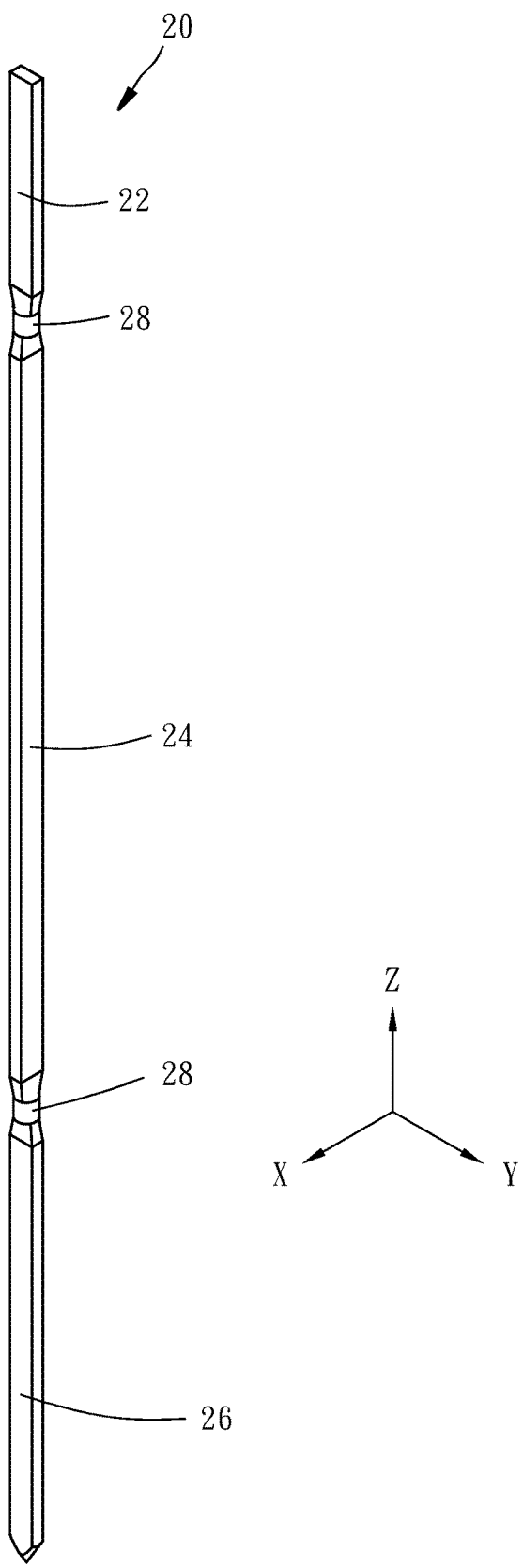
FIGS. 2-4 are a perspective view, a side view and a front view of a linear probe according to a first preferred embodiment of the present invention respectively.
Figure 3:
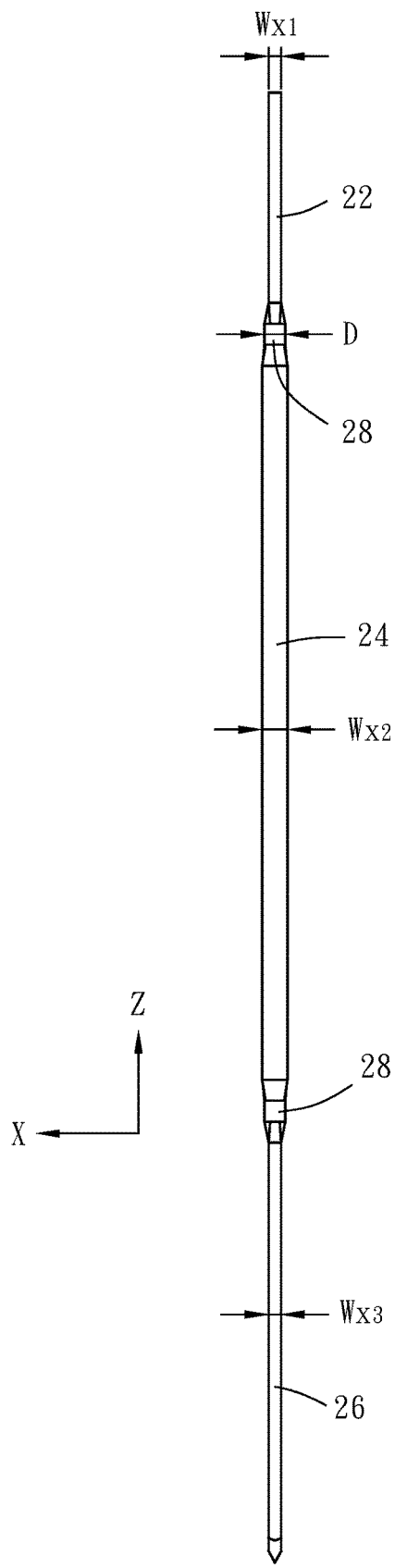
Figure 4:
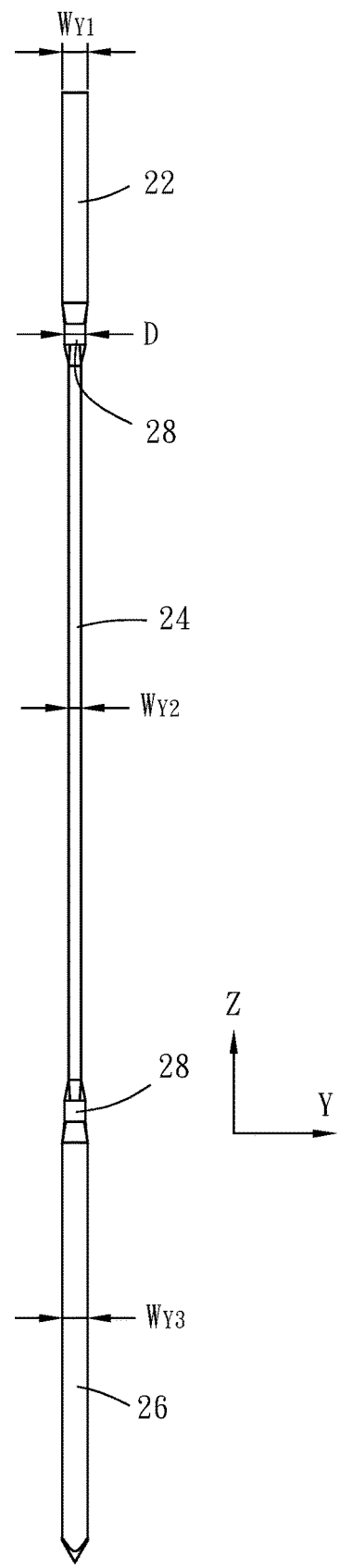

Referring to FIGS. 2-4, a linear probe 20 according to a first preferred embodiment of the present invention is formed in a way that a cylindrical needle, like the conventional linear probe 16 as shown in FIG. 1, is at least partially flattened to become the linear probe 20. After the manufacturing and before the installation and the use, the linear probe 20 is straight and has a tail portion 22, a body portion 24 and a head portion 26 extending along a longitudinal axis (Z-axis) in order. The technical term "flattened" mentioned in the entire specification and the claims of the present invention refers to that the linear probe is at least partially made into a flat shape in a specific processing manner. For example, the technical term "flattened" mentioned in the afore description that a cylindrical needle is at least partially "flattened" to become the linear probe 20, refers to that at least a part of the originally cylindrical-wire-shaped needle is processed by flattening. The flattening may, but unlimited to, be performed in a mechanical processing manner like forging, pressing or rolling. Generally speaking, the length of the body portion 24 is larger than double of the length of the tail portion 22, and the length of the body portion 24 is larger than double of the length of the head portion 26.

Figure 11:
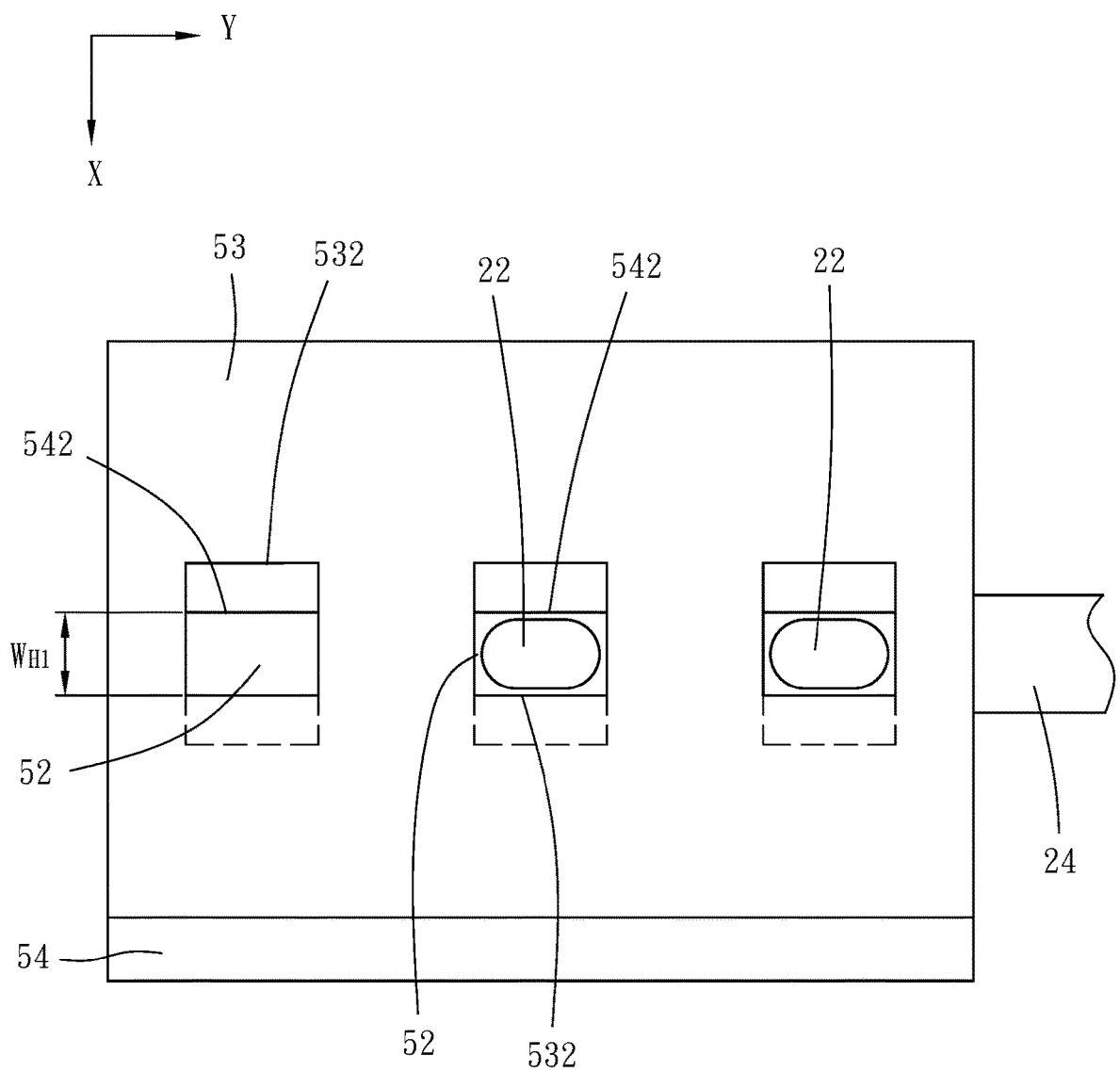
FIG. 11 is a partial top view of the probe head according to the first preferred embodiment of the present invention.

In this embodiment, the tail portion 22, body portion 24 and head portion 26 of the linear probe 20 are all flattened. Besides, the direction in which the body portion 24 is flattened is perpendicular to the direction in which the tail portion 22 and head portion 26 are flattened. There may, but unlimited to, be a non-flattened part 28 left between the tail portion 22 and the body portion 24 and another non-flattened part 28 left between the body portion 24 and the head portion 26. In other words, when it is mentioned in the present invention that the tail portion 22, body portion 24 and head portion 26 extend along the longitudinal axis (Z-axis) in order, it delimits the positional order and extending direction of the tail portion 22, body portion 24 and head portion 26 without delimiting that the tail portion 22, body portion 24 and head portion 26 have to be connected in order directly. Each of the non-flattened parts 28 is cylinder-shaped like the original needle, thereby having circular cross sections. Because the tail portion 22, body portion 24 and head portion 26 are flattened, the cross sections thereof substantially have an elongated shape with two arc sides, like the tail portion 22 as shown in FIG. 11. However, for simplifying the drawing, the flattened portions shown in the figures of the present invention other than FIG. 11 are shaped as columns having non-square rectangular cross sections without arc parts.

Because the flattened tail portion 22, body portion 24 and head portion 26 have approximately non-square rectangular cross sections, the linear probe 20 is defined with a first width axis (X-axis) perpendicular to the longitudinal axis (Z-axis) and a second width axis (Y-axis) perpendicular to the longitudinal axis (Z-axis) and the first width axis (X-axis) according to the shape of the flattened portions. The tail portion 22, body portion 24 and head portion 26 are defined with first widths $W_{X1}$, $W_{X2}$ and $W_{X3}$ along the first width axis (X-axis) and second widths $W_{Y1}$, $W_{Y2}$ and $W_{Y3}$ along the second width axis (Y-axis). Because the body portion 24 is flattened in the direction along the second width axis (Y-axis) from the original cylindrical needle, the first width $W_{X2}$ and the second width $W_{Y2}$ of the body portion 24 are respectively larger and smaller than the diameter of the needle, i.e. the diameter D of the non-flattened part 28. The tail portion 22 and head portion 26 are flattened in the direction along the first width axis (X-axis) from the original cylindrical needle, so the first widths $W_{X1}$ and $W_{X3}$ of the tail portion 22 and head portion 26 are smaller than the diameter D of the needle and the second width $W_{Y1}$ and $W_{Y3}$ of the tail portion 22 and head portion 26 are larger than the diameter D of the needle. In other words, the first width $W_{X2}$ and the second width $W_{Y2}$ of the body portion 24 are respectively larger than and smaller than the first width $W_{X1}$ and the second width $W_{Y1}$ of the tail portion 22, and respectively larger than and smaller than the first width $W_{X3}$ and the second width $W_{Y3}$ of the head portion 26.

Figure 5:
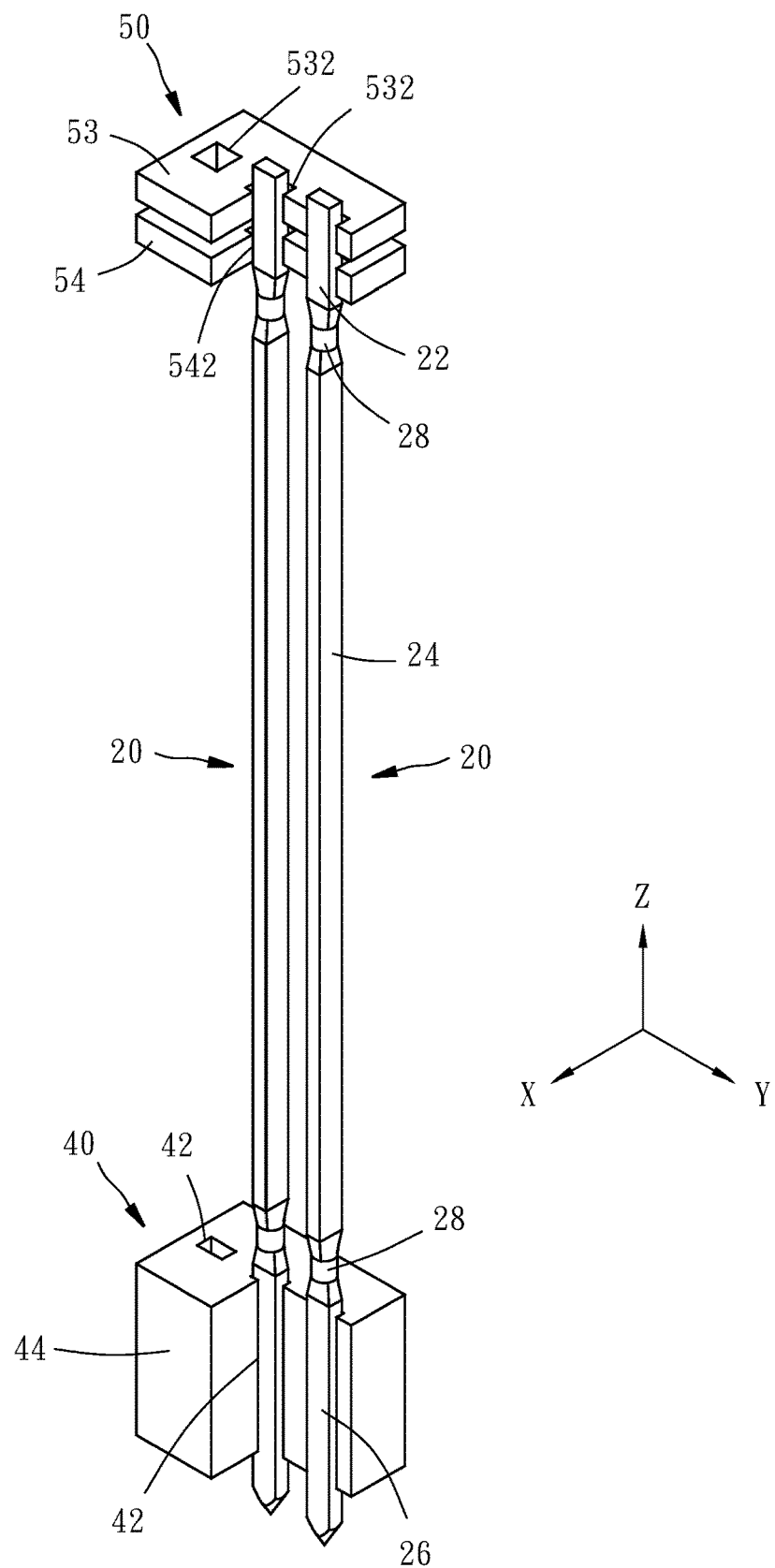
FIGS. 5-7 are a partially cut-off perspective view, a front view and a side view of a probe head in the middle step of the assembly process thereof according to the first preferred embodiment of the present invention respectively.
Figure 6:
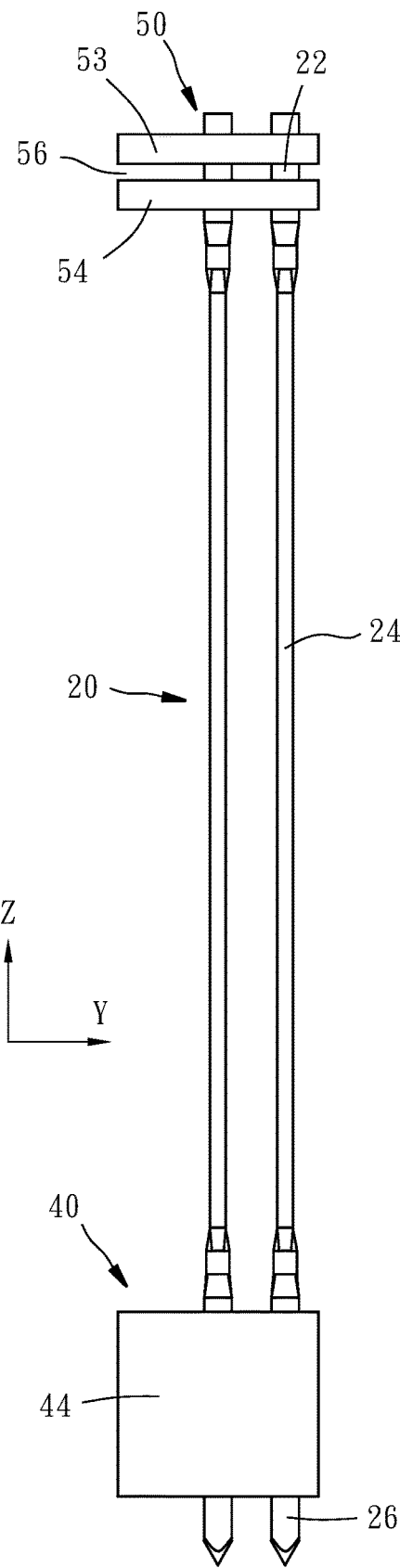
Figure 7:
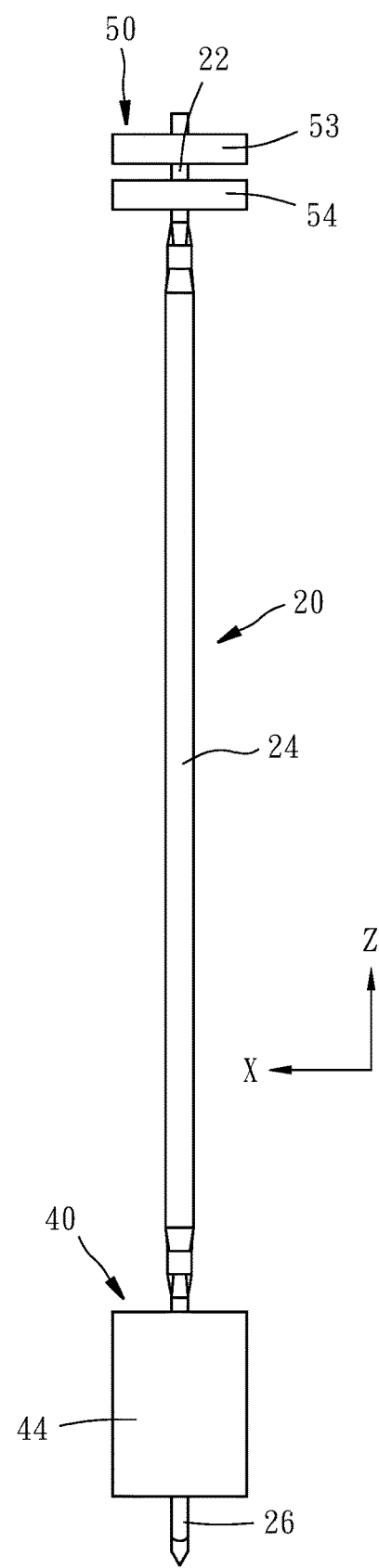
Figure 8:
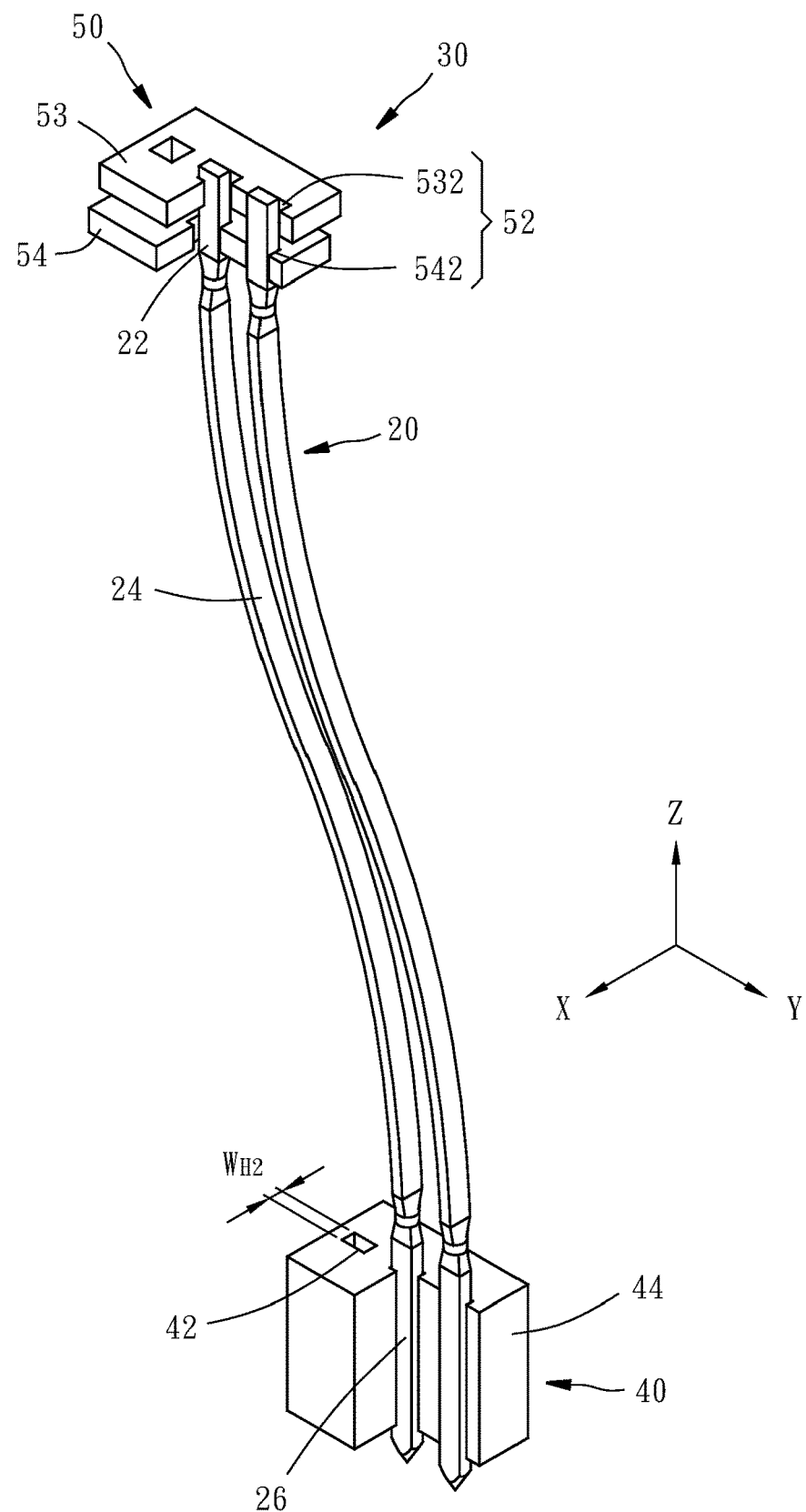
FIGS. 8-10 are a partially cut-off perspective view, a front view and a side view of the probe head according to the first preferred embodiment of the present invention respectively.

Referring to FIGS. 5-11, the linear probe 20 of the present invention is primarily applied in a probe head 30. The probe head 30 includes a lower die unit 40, an upper die unit 50 and a plurality of linear probes 20. The upper and lower die units 50 and 40 have a plurality of upper and lower installation holes 52 and 42 respectively for the installation of the linear probes 20. The probe head 30 usually includes hundreds or even thousands of linear probes 20, thereby also provided with hundreds or thousands of upper and lower installation holes 52 and 42. However, for the simplification of the figures and the convenience of illustration, only three upper installation holes 52, three lower installation holes 42 and two linear probe 20 are shown in the figures of the present invention. Besides, the upper and lower die units 50 and 40 shown in FIGS. 5 and 8 are partially cut-off for the convenience of illustrating the corresponding shapes of the upper and lower installation holes 52 and 42 and the linear probe 20.

Figure 9:
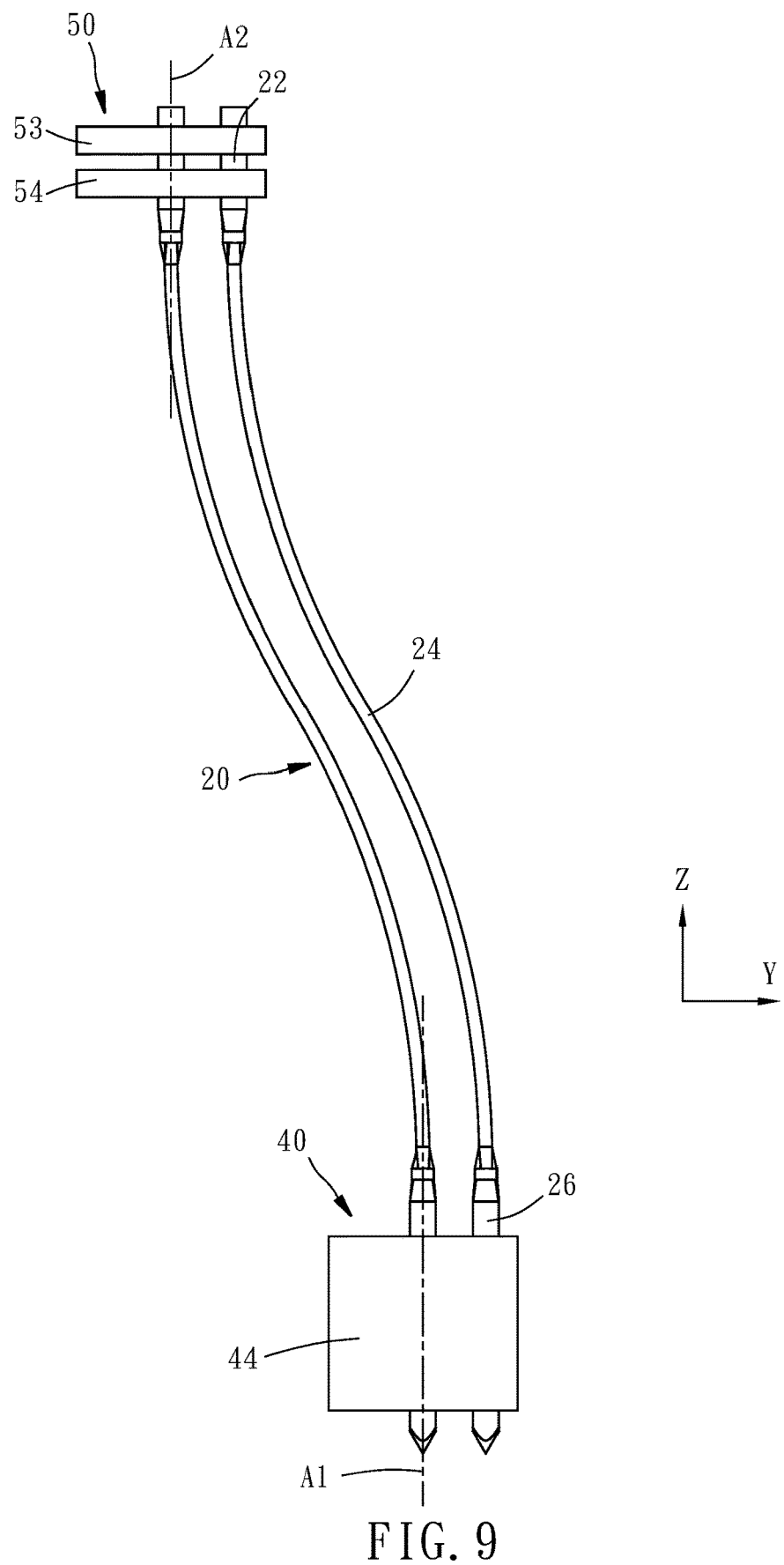
Figure 10:
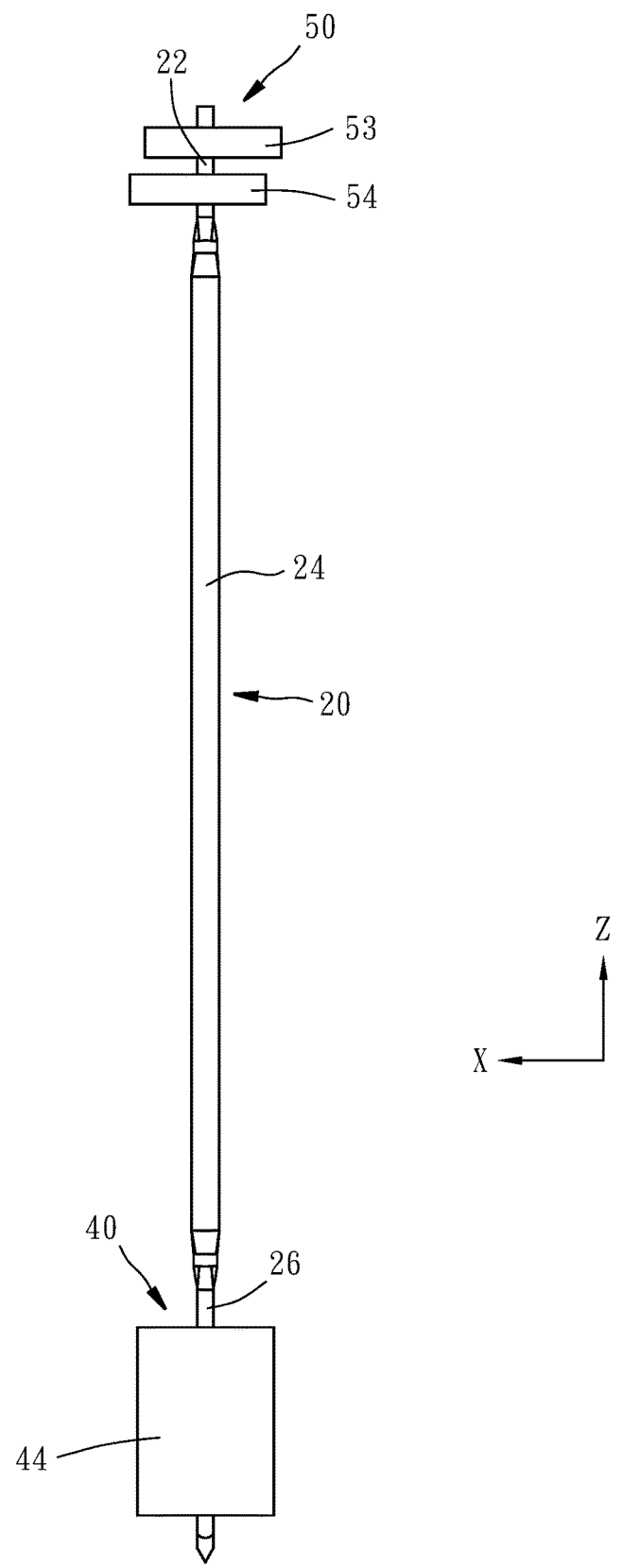

In this embodiment, the lower die unit 40 includes a lower die 44. However, the lower die unit 40 may be composed of a plurality of lower dies. Each of the lower installation holes 42 penetrates through the lower die 44 and is defined with a first central axis A1 as shown in FIG. 9. The upper die unit 50 includes a first upper die 53 and a second upper die 54, which are disposed above and parallel to the lower die 44. The first and second upper dies 53 and 54 are provided therebetween with a gap 56 by a cushion spacer (not shown) disposed between the first and second upper dies 53 and 54 or a fastening clamp fastening the first and second upper dies 53 and 54 spacedly. It should be noticed that in other embodiments, the first and second upper dies 53 and 54 may be directly piled on one another without the aforesaid spacer and gap 56 therebetween. As shown in FIG. 5, the first and second upper dies 53 and 54 have a plurality of first and second through holes 532 and 542 respectively for the head portion 26, body portion 24 and tail portion 22 of the linear probe 20 to be inserted therethrough. In this embodiment, each of the first and second through holes 532 and 542 is shaped as a square, each side of which is a little larger than the first width $W_{X2}$ of the body portion 24 and the second width $W_{Y1}$ and $W_{Y3}$ of the tail portion 22 and the head portion 26. However, each of the first and second through holes 532 and 542 may be shaped as a circle with the diameter a little larger than $W_{X2}$, $W_{Y1}$ and $W_{Y3}$ or other shapes adapted for the head portion 26, body portion 24 and tail portion 22 to be inserted therethrough. In this way, it is convenient for each linear probe 20 to be inserted downwardly from the top of the first through hole 532 through the first and second through holes 532 and 542 and then the lower installation hole 42, so that the head portion 26 of each linear probe 20 is inserted through the lower installation hole 42 and the tail portion 22 is inserted through the first and second through holes 532 and 542. At this time, as shown in FIGS. 5-7, the first through holes 532 are coaxial with the second through holes 542 respectively and coaxial with the lower installation holes 42 respectively, and the linear probes 20 are still straight.

As shown in FIGS. 8-11, after the linear probes 20 of the probe head 30 are all inserted through the upper and lower die units 50 and 40, the upper and lower die units 50 and 40 are displaced relative to each other along the second width axis (Y-axis), and the first and second upper dies 53 and 54 are displaced relative to each other along the first width axis (X-axis), so that the formerly coaxial first and second through holes 532 and 542 are offset from each other along the first width axis (X-axis) to collectively form the non-square rectangular upper installation hole 52 as shown in FIG. 11. Each of the upper installation holes 52 is defined with a second central axis A2 passing through the center thereof, as shown in FIG. 9. For the same linear probe 20, the associated first central axis A1 and second central axis A2 are offset from each other along the second width axis (Y-axis), so that the body portion 24 of each linear probe 20 is curved and thereby has the elastically adjusting function and buffering function.

With the feature that the first and second widths of the body portion 24 are respectively larger than and smaller than the first and second widths of the tail portion 22 and the head portion 26, the area moment of inertia of the body portion 24 has significant and specific difference from the area moment of inertia of the tail portion 22 and the head portion 26, and such difference in the area moment of inertia makes the body portion 24 liable to elastic bending deformation in a specific direction when the linear probe 20 is applied with a force along the second width axis (Y-axis). Specifically speaking, considering the condition that the cross sections of the tail portion 22, body portion 24 and head portion 26 are non-square rectangular, the formula for the area moment of inertia $I_x$ of the body portion 24 with respect to the first width axis (X-axis) is $I_x=W_{X2} W_{Y2}^3/12$, and the formulas for the area moment of inertia $I_x$ of the tail portion 22 and the head portion 26 with respect to the first width axis (X-axis) are $I_x=W_{X1}W_{Y1}^3/12$ and $I_x=W_{X3} W_{Y3}^3/12$ respectively. It can be thus known that the area moment of inertia Ix of the body portion 24 is smaller than the area moment of inertia of Ix of the tail portion 22 and the head portion 26. When the upper and lower die units 50 and 40 are displaced relative to each other along the second width axis (Y-axis) to apply a force along the second width axis (Y-axis) to the linear probe 20, the body portion 24 is particularly liable to elastic bending deformation on the Y-Z plane, as shown in FIG. 9, while the tail portion 22 and the head portion 26 are particularly unbendable. Besides, the tail portion 22 and the head portion 26 have relatively larger strength for resisting the force due to the relative displacement of the upper and lower die units 50 and 40, thereby prevented from the damage due to the friction between the portions 22 and 26 and the dies 44, 53 and 54, and preventing the dies 44, 53 and 54 from fractures on the peripheries of the installation holes 42 and 52.

As a result, setting the first and second widths of the tail portion 22, body portion 24 and head portion 26 can control the directions of the deformation and movement of the linear probe 20 due to the relative displacement between the upper and lower die units 50 and 40 and the contact between the head portion 26 and the device under test in a way that the probes 20 of the same probe head 30 are consistent in bending direction and moving behavior thereof and thereby prevented from interference and short circuit. In particular, the size of the body portion 24 is more influential in the above-mentioned effects, which is adjustable according to the practical demanding conditions. The sizes of the tail portion 22 and the head portion 26 are not only adjustable for improving the above-mentioned effects, but also adjustable according to the size of the device under test.

Besides, the body portion 24 and the tail portion 22 have the above-described difference in first and second widths, and the upper installation hole 52 is shaped as a non-square rectangle from the first and second through holes 532 and 542 offset from each other along the first width axis (X-axis) so that the width $W_{H1}$ of the upper installation hole 52 defined along the first width axis (X-axis) as shown in FIG. 11 is smaller than the first width $W_{X2}$ of the body portion 24. Therefore, the body portion 24 needs no additional stopping portion, but itself can be abutted on the bottom surface of the upper die unit 50 so as to avoid the problem of probe escape. Likewise, the body portion 24 and the head portion 26 have the above-described difference in first and second widths, and the lower installation hole 42 is shaped as a non-square rectangle with the width $W_{H2}$ defined along the first width axis (X-axis) as shown in FIG. 8 smaller than the first width $W_{X2}$ of the body portion 24. Therefore, the body portion 24 needs no additional stopping portion, but itself can be abutted on the top surface of the lower die unit 40 so as to avoid the problem of probe drop. In addition, because the flattened tail portion 22 and head portion 26 are cross-sectionally elongated-shaped and inserted through the elongated-shaped upper and lower installation holes 52 and 42, the linear probe 20 is prevented from self-rotation when contacting the device under test. Besides, the tail portion 22 and the head portion 26 can move smoothly in the upper and lower installation holes 52 and 42 and release stress because of having arc-shaped parts.

Figure 12:
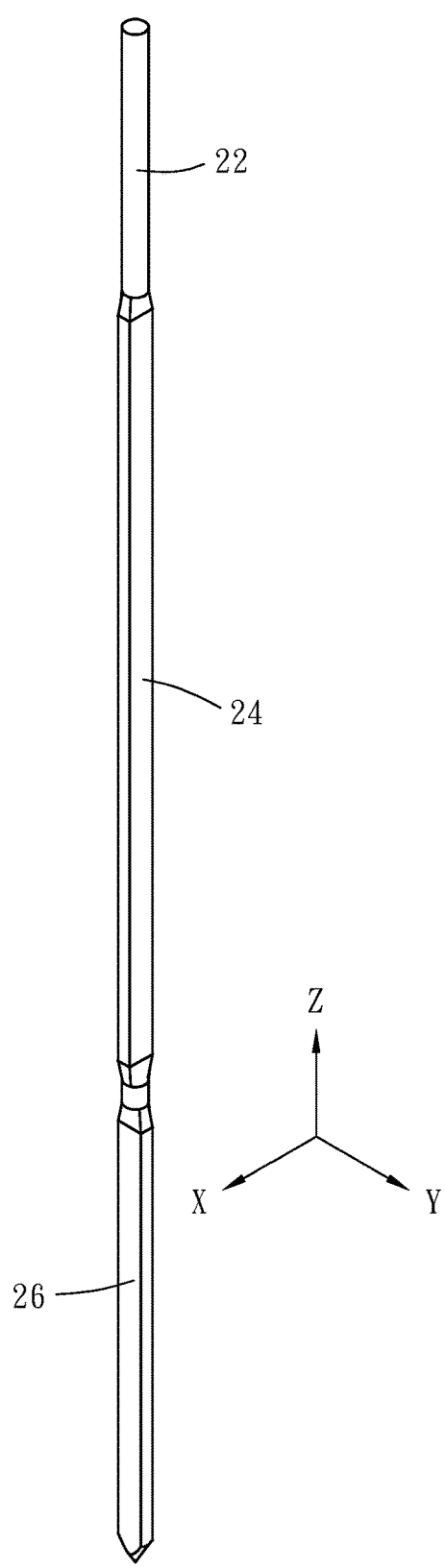
FIGS. 12-17 are perspective views of linear probes according to second to seventh preferred embodiments of the present invention.
Figure 13:
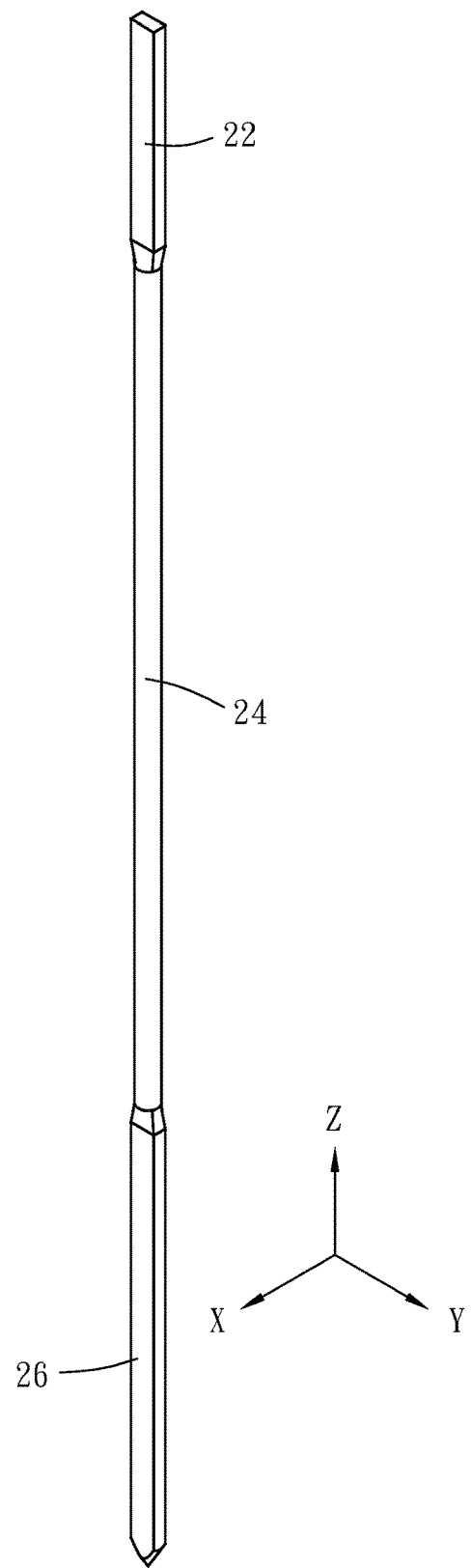
Figure 14:
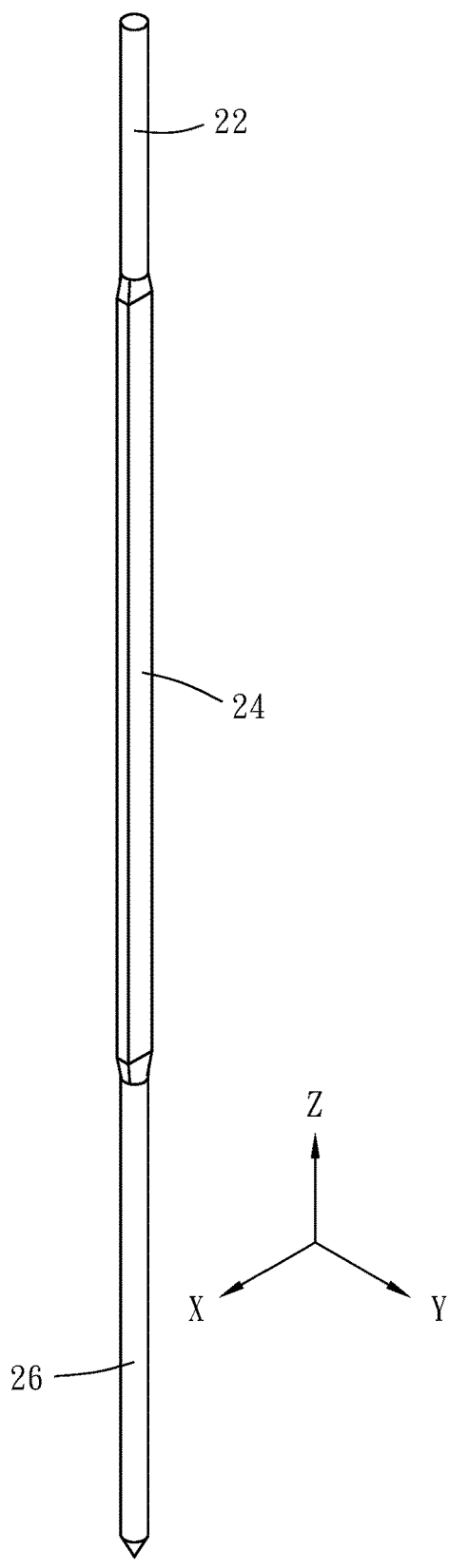
Figure 15:
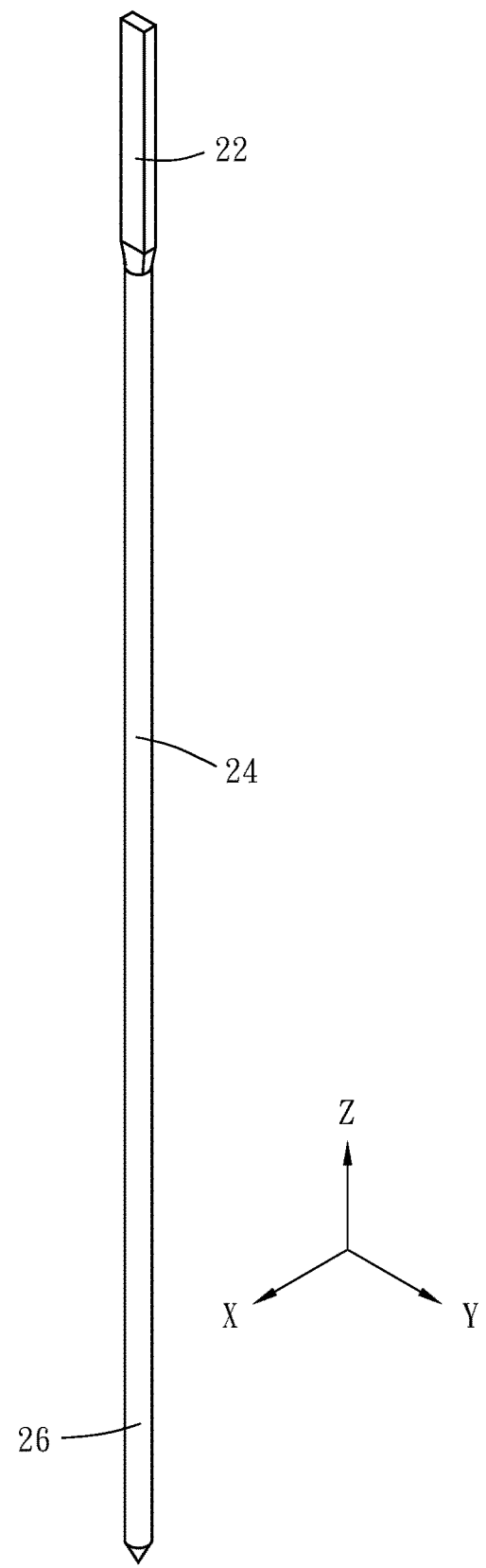

Referring to FIGS. 12-15, FIGS. 12-15 show the linear probes according to second to fifth preferred embodiments of the present invention, in the condition as shown in FIGS. 12 and 14 that the body portion 24 is flattened but the tail portion 22 is not flattened and thereby maintained with the cylindrical shape and the first and second widths $W_{X1}$ and $W_{Y1}$ both equal to the diameter D of the needle, and in the condition as shown in FIGS. 13 and 15 that the tail portion 22 is flattened but the body portion 24 is not flattened and thereby maintained with the cylindrical shape and the first and second widths $W_{X2}$ and $W_{Y2}$ both equal to the diameter D of the needle. Under these conditions, the first width $W_{X2}$ of the body portion 24 is still larger than the first width $W_{X1}$ of the tail portion 22. Therefore, the above-mentioned effect of avoiding probe escape can be attained in a way that the width $W_{H1}$ of the upper installation hole 52 is smaller than the first width $W_{X2}$ of the body portion 24, wherein if the upper installation hole 52 is a circular hole, the width $W_{H1}$ thereof equals to the diameter thereof.

Figure 16:
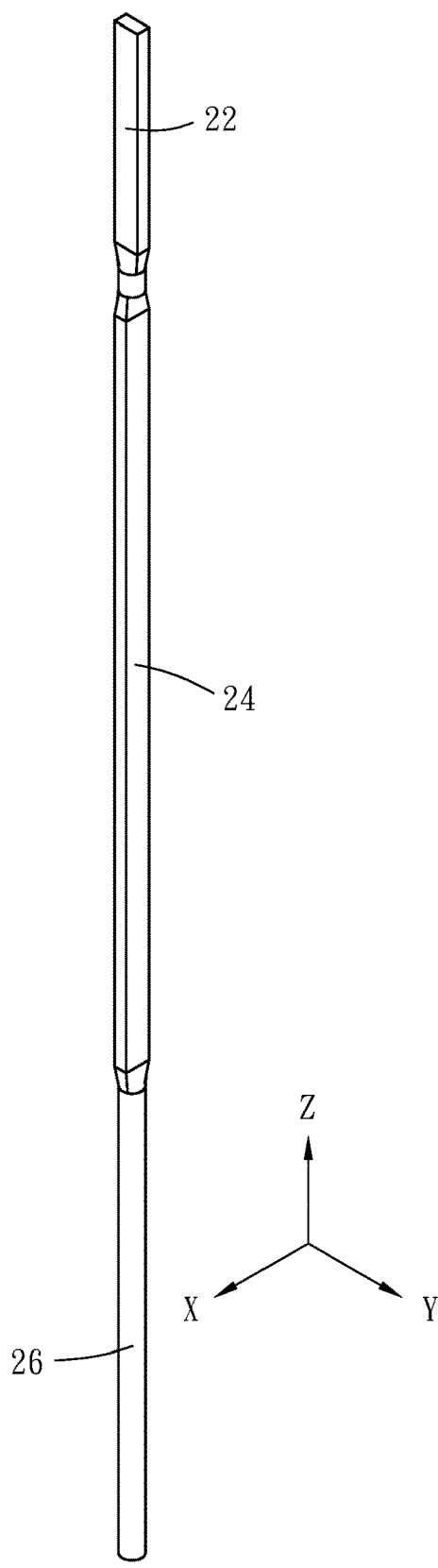
Figure 17:
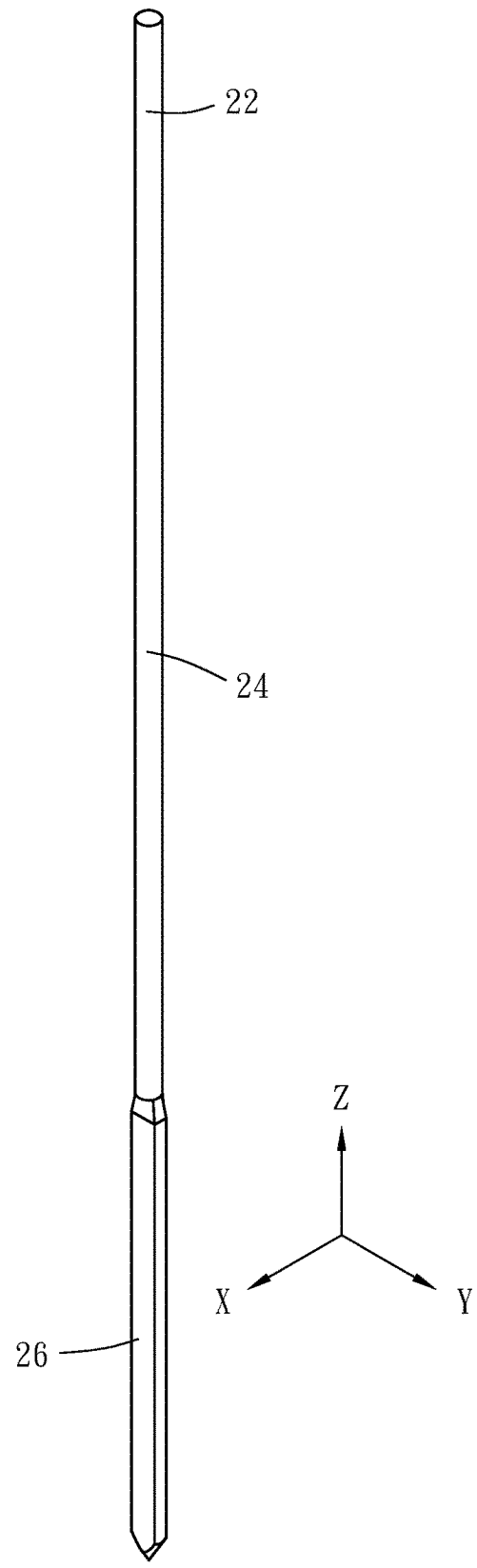

FIGS. 13, 14, 16 and 17 show the linear probes according to the third, fourth, sixth and seventh preferred embodiments of the present invention, in the condition as shown in FIGS. 14 and 16 that the body portion 24 is flattened but the head portion 26 is not flattened and thereby maintained with the cylindrical shape and the first and second widths $W_{X3}$ and $W_{Y3}$ both equal to the diameter D of the needle, and in the condition as shown in FIGS. 13 and 17 that the head portion 26 is flattened but the body portion 24 is not flattened and thereby maintained with the cylindrical shape. Under these conditions, the first width $W_{X2}$ of the body portion 24 is still larger than the first width $W_{X3}$ of the head portion 26. Therefore, the above-mentioned effect of avoiding probe drop can be attained in a way that the width $W_{H2}$ of the lower installation hole 42 is smaller than the first width $W_{X2}$ of the body portion 24, wherein if the lower installation hole 42 is a circular hole, the width $W_{H2}$ thereof equals to the diameter thereof.

In the second to seventh preferred embodiments of the present invention as shown in FIGS. 12-17, only one or two of the tail portion 22, body portion 24 and head portion 26 are flattened. In such condition, the first and second widths of the body portion 24 are still respectively larger than and smaller than the first and second widths of at least one of the tail portion 22 and the head portion 26. Therefore, setting the first and second widths can still make the area moment of inertia (Ix) of the body portion 24 with respect to the first width axis (X-axis) smaller than the area moment of inertia of (Ix) of at least one of the tail portion 22 and the head portion 26 with respect to the first width axis (X-axis), thereby resulting in consistent bending direction and moving behavior of the probes 20 of the same probe head 30.

In the above-described first preferred embodiment, the lower installation hole 42 is provided with the area approximately just adapted for the head portion 26 to be inserted therethrough, thereby attaining the effects of avoiding probe drop and preventing the probe from self-rotation. Besides, the upper installation hole 52 is formed with an elongated shape a little larger than the tail portion 22 (the upper installation hole 52 is formed from the first and second through holes 532 and 542 offset from each other and each having an area larger than the lower installation hole 42), thereby attaining the effects of avoiding probe escape, preventing the probe from self-rotation and convenience for the installation of the probe. However, the lower installation hole 42 is unlimited to be shaped as a non-square rectangle. As long as the lower installation hole 42 has an elongated shape, the effects of avoiding probe drop and preventing the probe from self-rotation can be attained by the lower installation hole 42 and the flattened head portion 26 collectively. In the condition that the head portion 26 is not flattened and maintained with the cylindrical shape, the lower installation hole 42 may be not elongated-shaped, but shaped as a circle, square, and so on, such that the effect of avoiding probe drop can be still attained. Likewise, the upper installation hole 52 is unlimited to be shaped as a non-square rectangle. As long as the upper installation hole 52 has an elongated shape, the effects of avoiding probe escape and preventing the probe from self-rotation can be attained by the upper installation hole 52 and the flattened tail portion 22 collectively. In the condition that the tail portion 22 is not flattened and maintained with the cylindrical shape, the upper installation hole 52 may be not elongated-shaped, but shaped as a circle, square, and so on, such that the effect of avoiding probe escape can be still attained. However, in the condition that the upper and lower installation holes 52 and 42 are elongated-shaped, the body portion 24 can be abutted on relatively larger areas of the bottom surface of the upper die unit 50 and the top surface of the lower die unit 40 around the upper and lower installation holes 52 and 42, such that the effects of avoiding probe escape and probe drop are relatively better. No matter the tail portion 22 is flattened or not, the upper installation hole 52 is unlimited to be formed from two through holes collectively, which means the upper die unit 50 may include only one upper die where the upper installation hole 52 penetrates, as long as the upper installation hole 52 is adapted for the tail portion 22 to be inserted therethrough.

Figure 18:
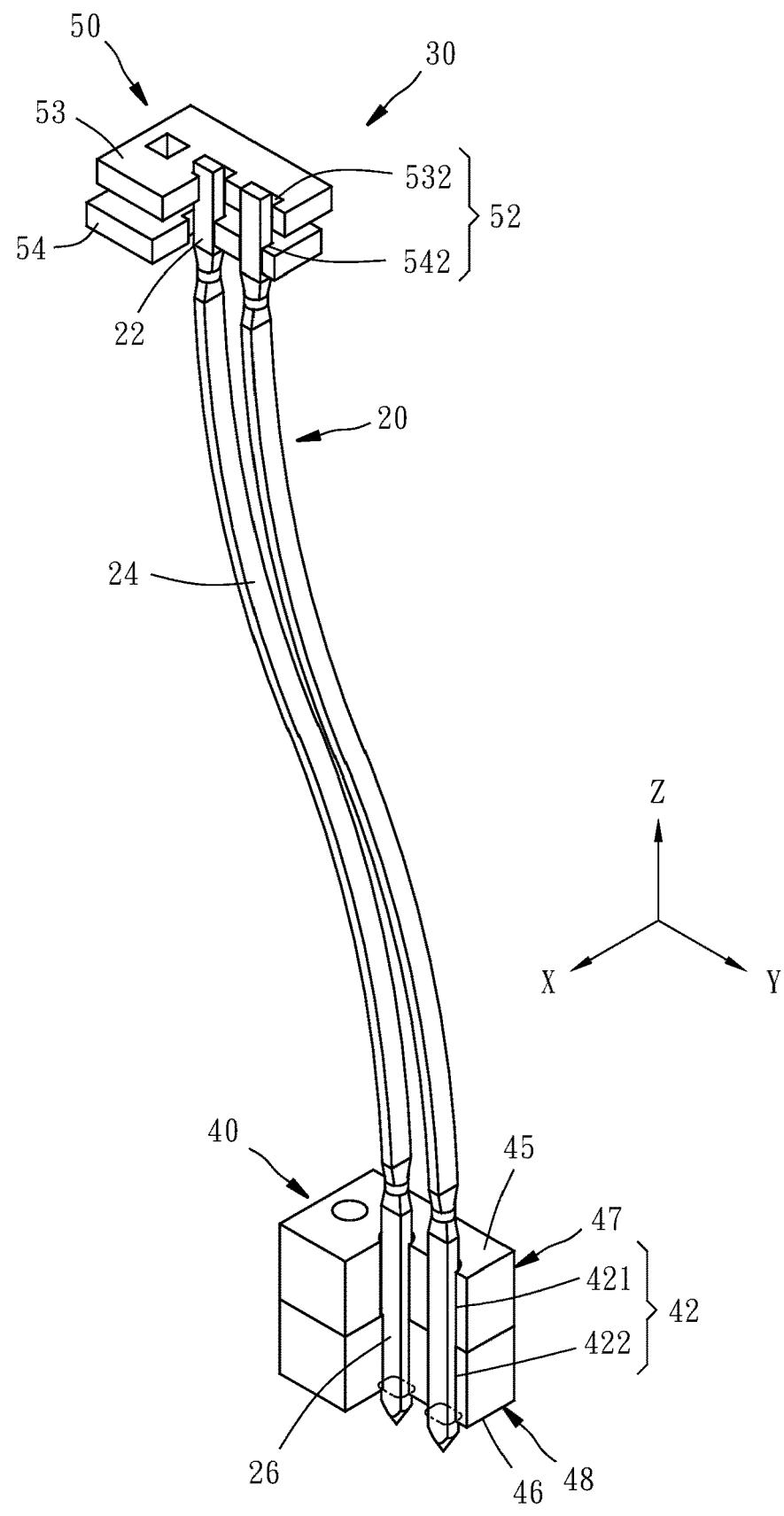
FIG. 18 is a partially cut-off perspective view of a probe head according to an eighth preferred embodiment of the present invention.
Figure 19:
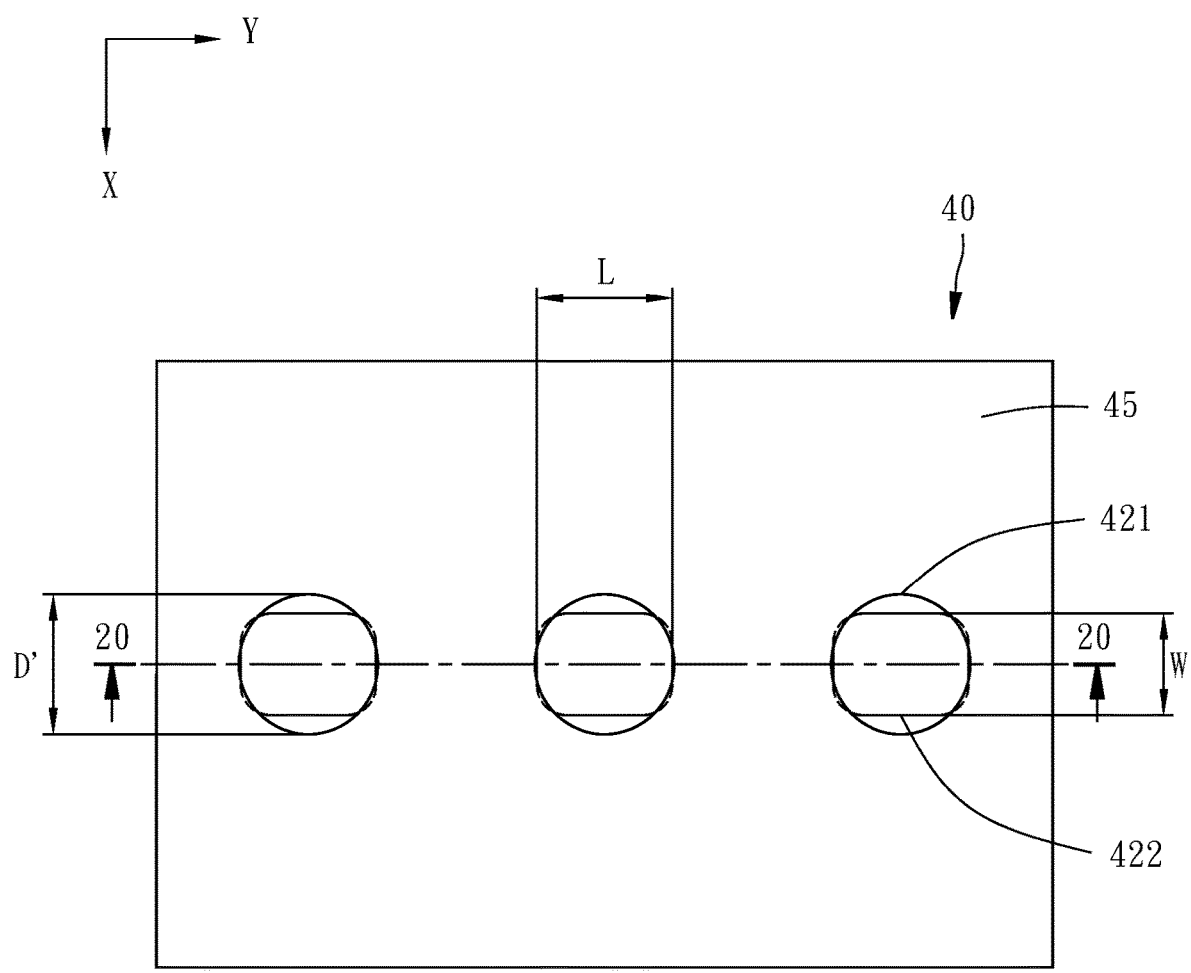
FIG. 19 is a partial top view of a lower die unit of the probe head according to the eighth preferred embodiment of the present invention.
Figure 20:
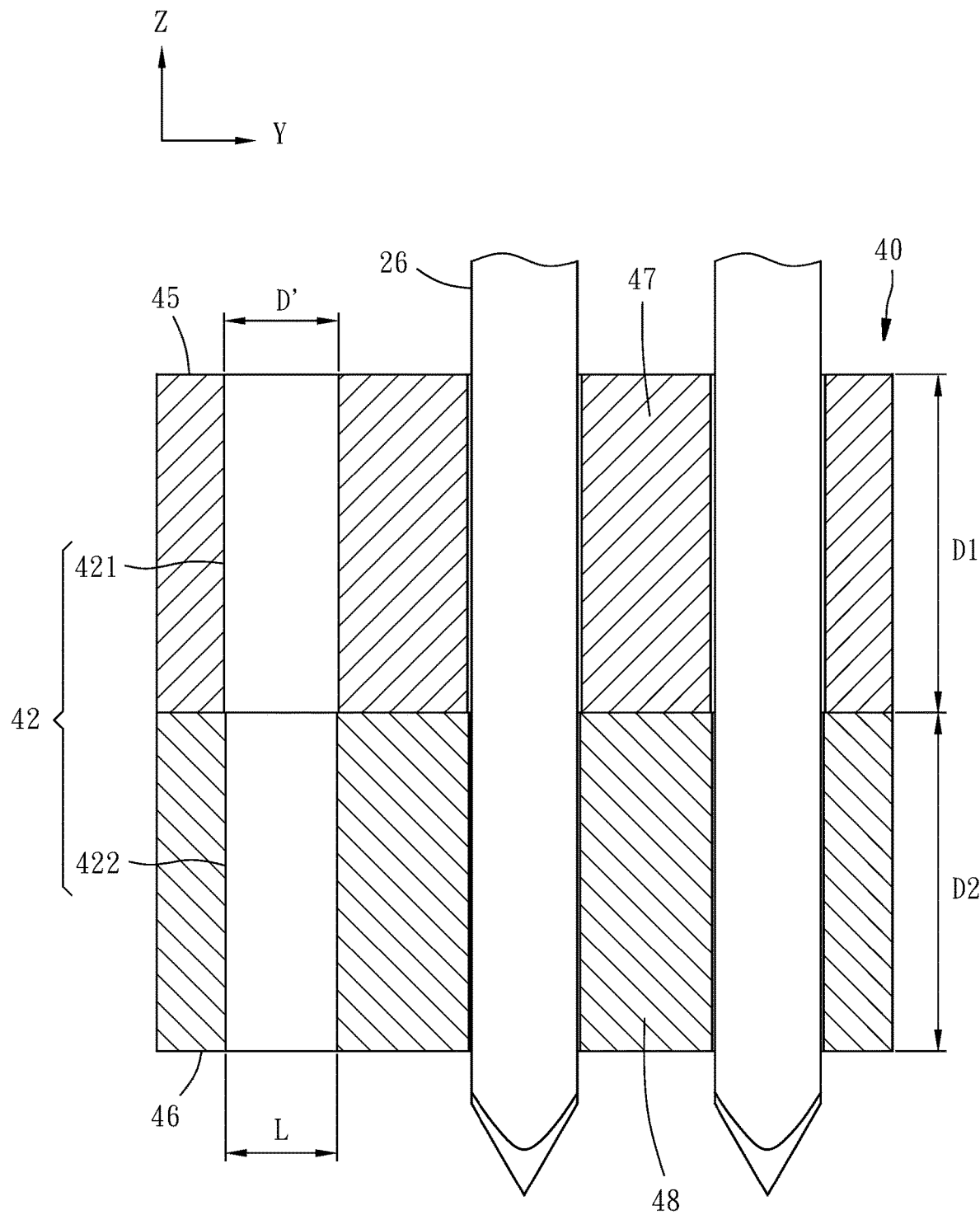
FIG. 20 is a schematically sectional view taken along the line 20-20 in FIG. 19, but additionally showing a head portion of the linear probe.

Referring to FIGS. 18-20, FIGS. 18-20 show an eighth preferred embodiment of the present invention in the condition that the head portion 26 is flattened and thereby the cross sections thereof have an elongated shape. Under this condition, the lower installation hole 42 may be elongated-shaped at only a part thereof. Specifically speaking, the lower die unit 40 includes a top surface 45 and a bottom surface 46 opposite to the top surface 45, and the top surface 45 faces toward the upper die unit 50. The lower installation hole 42 includes an upper part 421 extending from the top surface 45 toward the bottom surface 46, and a lower part 422 extending from the bottom end of the upper part 421 to the bottom surface 46. The lower part 422 is an elongated-shaped hole for the head portion 26 to be inserted therethrough. For example, in this embodiment, the cross section of the lower part 422 of the lower installation hole 42 is substantially shaped as a non-square rectangle with arc chamfering. The upper part 421 is a circular hole and the diameter D' thereof is larger than the length L and width W of the elongated-shaped hole 422 and also larger than the first width $W_{X2}$ and the second width $W_{Y2}$ of the body portion 24. The lower die unit 40 may be composed of first and second lower dies 47 and 48 piled on one another and made of the same material or different material, so that it is convenient to process the upper part 421 and the lower part 422 penetrating through the first and second lower dies 47 and 48 respectively.

In this way, the circular upper part 421 of the lower installation hole 42 can reduce the wear of the head portion 26 and the lower die unit 40, and the body portion 24 can enter the upper part 421 to be stopped at the top end of the lower part 422, i.e. the top surface of the second lower die 48, so the lower part 421 of the lower installation hole 42 is still effective in avoiding probe drop and preventing the probe from self-rotation. The above-mentioned effects may be attained in a way that the diameter D' of the upper part 421 of the lower installation hole 42 is designed to be equal to the length L of the elongated-shaped hole 422.

Figure 21:
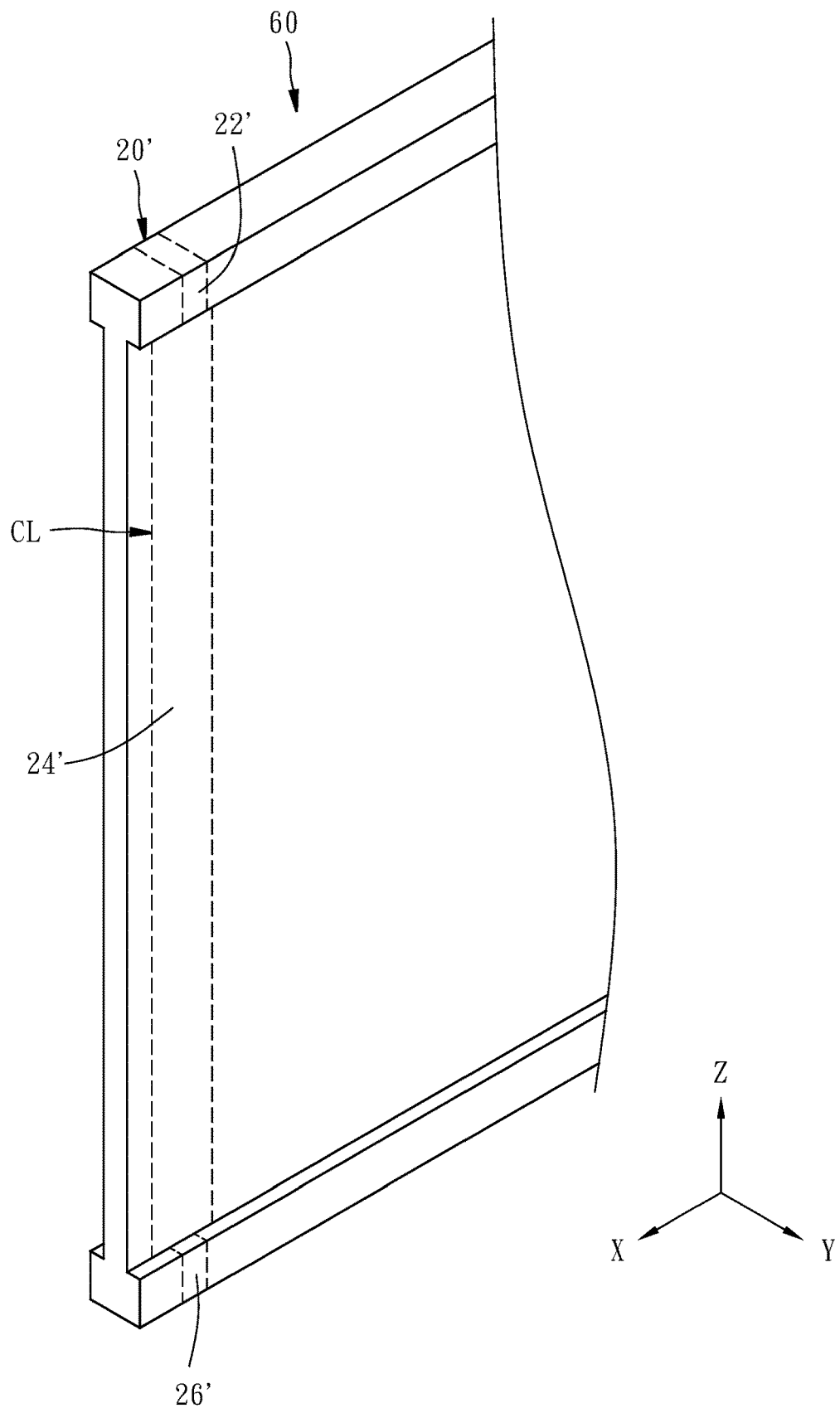
FIG. 21 is a schematic perspective view showing a state in the manufacturing process of a linear probe according to a ninth preferred embodiment of the present invention.

It should be appreciated that in the entire specification and the claims of the present invention, the linear probe refers to that the probe is long and straight after the manufacturing and before the installation and the use, which means the linear probe is unlimited to the probe formed from the cylindrical wire needle being at least partially flattened like the probe in the above embodiments. For example, FIG. 21 is a schematic perspective view showing a state in the manufacturing process of a linear probe 20' according to a ninth preferred embodiment of the present invention, wherein a plate 60 capable of being cut into the linear probe 20' is shown. The plate 60 is formed in a way that a board is shaped by an etching process of MEMS (microelectromechanical systems) or a mechanical cutting process to become the plate 60 having two thick lateral sections for forming the tail portion 22' and the head portion 26' and a thin middle section for forming the body portion 24'. After that, the plate 60 is cut by laser along a cutting line CL as shown in FIG. 21, such that the linear probe 20' is formed and the tail, body and head portions 22', 24' and 26' thereof are all flattened in a way that the long sides of the cross sections of the tail and head portions 22' and 26' are parallel to Y-axis and the long sides of the cross sections of the body portion 24' are parallel to X-axis.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A probe head comprising:
   a linear probe comprising a tail portion, a body portion and a head portion extending along a longitudinal axis in order, at least one of the tail portion, the body portion and the head portion being flattened and thereby defined with a first width axis perpendicular to the longitudinal axis and a second width axis perpendicular to the longitudinal axis and the first width axis, each of the tail portion, the body portion and the head portion being defined with a first width along the first width axis and a second width along the second width axis, the first width and the second width of the body portion being respectively larger than and smaller than the first width and the second width of at least one of the tail portion and the head portion;
   a lower die unit having a lower installation hole, the head portion of the linear probe being inserted through the lower installation hole, the lower installation hole being defined with a first central axis; and
   an upper die unit having an upper installation hole, the tail portion of the linear probe being inserted through the upper installation hole, the upper installation hole being defined with a second central axis, the second central axis being offset from the first central axis along the second width axis and thereby the body portion of the linear probe is curved, the upper die unit comprising a first upper die and a second upper die, the first upper die having a first through hole for the tail portion, the body portion and the head portion of the linear probe to be inserted therethrough, the second upper die having a second through hole for the tail portion, the body portion and the head portion of the linear probe to be inserted therethrough, the first through hole and the second through hole being offset from each other along the first width axis to collectively form the upper installation hole.

2. The probe head as claimed in claim 1, wherein with respect to the first width axis, area moment of inertia of the body portion is smaller than area moment of inertia of at least one of the tail portion and the head portion.

3. The probe head as claimed in claim 1, wherein the linear probe is formed in a way that a cylindrical needle is at least partially flattened to become the linear probe; the body portion is flattened and thereby the first width and the second width of the body portion are respectively larger than and smaller than a diameter of the needle.

4. The probe head as claimed in claim 3, wherein the tail portion is flattened and thereby the first width and the second width of the tail portion are respectively smaller than and larger than the diameter of the needle.

5. The probe head as claimed in claim 3, wherein the head portion is flattened and thereby the first width and the second width of the head portion are respectively smaller than and larger than the diameter of the needle.

6. The probe head as claimed in claim 3, wherein the head portion is cylinder-shaped and thereby the first width and the second width of the head portion are both equal to the diameter of the needle.

7. The probe head as claimed in claim 3, wherein the tail portion is cylinder-shaped and thereby the first width and the second width of the tail portion are both equal to the diameter of the needle.

8. The probe head as claimed in claim 1, wherein the linear probe is formed in a way that a cylindrical needle is at least partially flattened to become the linear probe; the body portion is cylinder-shaped and thereby the first width and the second width of the body portion are both equal to a diameter of the needle; the tail portion is flattened and thereby the first width and the second width of the tail portion are respectively smaller than and larger than the diameter of the needle.

9. The probe head as claimed in claim 1, wherein the linear probe is formed in a way that a cylindrical needle is at least partially flattened to become the linear probe; the body portion is cylinder-shaped and thereby the first width and the second width of the body portion are both equal to a diameter of the needle; the head portion is flattened and thereby the first width and the second width of the head portion are respectively smaller than and larger than the diameter of the needle.

10. The probe head as claimed in claim 9, wherein the tail portion is cylinder-shaped and thereby the first width and the second width of the tail portion are both equal to the diameter of the needle.

11. The probe head as claimed in claim 1, wherein said at least one of the tail portion, the body portion and the head portion being flattened has a cross section substantially having an elongated shape with two arc sides.

12. The probe head as claimed in claim 1, wherein an area of the first through hole and an area of the second through hole are both larger than an area of the lower installation hole.

13. The probe head as claimed in claim 1, wherein each of the first through hole and the second through hole is shaped as one of a circle and a square.

14. The probe head as claimed in claim 1, wherein the lower installation hole is rectangle-shaped.

15. The probe head as claimed in claim 1, wherein the lower installation hole is defined with a width along the first width axis, and the width is smaller than the first width of the body portion.

16. The probe head as claimed in claim 1, wherein the upper installation hole is defined with a width along the first width axis, and the width is smaller than the first width of the body portion.

17. The probe head as claimed in claim 1, wherein a length of the body portion is larger than double of a length of the tail portion; the length of the body portion is larger than double of a length of the head portion.

18. The probe head as claimed in claim 1, wherein the head portion is flattened and thereby has a cross section having an elongated shape; the lower die unit comprises a top surface and a bottom surface opposite to the top surface; the top surface faces toward the upper die unit; the lower installation hole comprises an upper part extending from the top surface toward the bottom surface, and a lower part extending from the upper part to the bottom surface; the lower part is an elongated-shaped hole for the head portion to be inserted therethrough; the upper part is a circular hole and a diameter thereof is larger than or equal to a length of the elongated-shaped hole and larger than a width of the elongated-shaped hole and the first width and the second width of the body portion.

19. The probe head as claimed in claim 18, wherein a cross section of the lower part of the lower installation hole is substantially shaped as a non-square rectangle with arc chamfering.

20. The probe head as claimed in claim 18, wherein the lower die unit comprises first and second lower dies piled on one another; the upper and lower parts of the lower installation hole are located in the first and second lower dies respectively.

* * * * *